United States Patent [19]

Hoshino

[11] Patent Number: 5,532,600
[45] Date of Patent: Jul. 2, 1996

[54] METHOD OF AND APPARATUS FOR EVALUATING RELIABILITY OF METAL INTERCONNECT

[75] Inventor: Kazuhiro Hoshino, Kanagawa, Japan

[73] Assignee: Sony Corporation, Tokyo, Japan

[21] Appl. No.: 329,401

[22] Filed: Oct. 27, 1994

[30] Foreign Application Priority Data

Oct. 19, 1993 [JP] Japan .................... 5-293899

[51] Int. Cl.⁶ .................... G01R 31/26; G01R 27/08
[52] U.S. Cl. .................... 324/537; 324/717; 324/719; 324/765
[58] Field of Search .................... 324/537, 715, 324/717, 718, 719, 760, 158.1, 765; 437/8

[56] References Cited

U.S. PATENT DOCUMENTS

| | | | |
|---|---|---|---|
| 3,676,775 | 7/1972 | Dupnock et al. | 324/717 |
| 4,520,448 | 5/1985 | Tremintin | 324/768 X |
| 4,945,302 | 7/1990 | Janum | 324/760 X |
| 5,057,441 | 10/1991 | Gutt et al. | 324/719 X |
| 5,239,270 | 8/1993 | Desbiens | 324/719 |
| 5,260,668 | 11/1993 | Mallory et al. | 324/760 X |

*Primary Examiner*—Kenneth A. Wieder
*Assistant Examiner*—Diep Do
*Attorney, Agent, or Firm*—Hill, Steadman & Simpson

[57] ABSTRACT

Disclosed is a method of and an apparatus for evaluating the reliability of metal interconnects. It is capable of performing the evaluation under such a testing condition as to reproduce an actual operating environment, that is, under the testing condition of simultaneously accelerating electromigration and stress-induced migration, thereby evaluating failures conventionally missed to be evaluated. In particular, this method is applicable for evaluating the reliability of metal interconnects of semiconductor devices, and which includes the steps of performing a constant-temperature storage test I for interconnect reliability evaluation at a temperature over a specified temperature for a specified time; and applying a current to the interconnect and simultaneously performing a test II of measuring a voltage of the interconnect.

18 Claims, 5 Drawing Sheets

5,532,600

1

METHOD OF AND APPARATUS FOR EVALUATING RELIABILITY OF METAL INTERCONNECT

BACKGROUND OF THE INVENTION

The present invention relates to a method of and an apparatus for evaluating the reliability of metal interconnects. In particular, the present invention is applicable for a method of and an apparatus for evaluating the reliability of metal interconnects of semiconductor devices.

The evaluation of metal interconnect reliability is important. For example, in the field of semiconductor devices, along with the strong demand toward the high integration of very high LSIs, the evaluation of metal interconnect reliability becomes important. In particular, there is required a reliability evaluating means compatible with the actual device operating environment.

As the method of evaluating the reliability of metal interconnects, there has been used an electromigration evaluating test for a long time. This test is performed by applying a specified current to a metal interconnect at an environment temperature of about 200° C., and then measuring the lifetime either until the breakage occurs or until the resistance increase over a threshold value. On the other hand, in recent years, there have arisen a problem of a failure mode due to the so-called stress-induced migration, that is, damages of metal interconnects due to mechanical factors, for example, the breakage of metal interconnect due to a stress applied from a cover film or the like. A stress-induced migration evaluating test has been used to evaluate the above failure due to the stress-induced migration.

As for the testing time, the electromigration evaluating test takes a time ranging from several minutes to several hundreds hours; while the stress-induced migration evaluating test takes a time of several thousands hour. Accordingly, these failure phenomena are different from each other in the time required for generation of a failure.

In the actual operating environment, electromigration and stress-induced migration seem to progress simultaneously; accordingly, even when these two acceleration tests are separately performed, the actual operating environment cannot be sufficiently reproduced.

For example, in a layered Al interconnect 12 with a barrier metal 11 such as TiN shown in FIG. 4, a slit-like void shown in FIG. 5 is possibly generated as a failure after constant-temperature storage testing. In this case, the prior art electromigration evaluation fails to detect the above failure because the resistance is little changed and the electric conduction is kept by the redundant effect of the barrier metal. Namely, as typically shown in FIG. 6 a current flows in the barrier metal 11 along the path shown by the numeral 14, so that the breakage is evaluated. On the other hand, when the electromigration evaluation is made separately from the above stress-induced evaluation in accordance with the conventional manner, the interconnect with no slit-like void is, of course, evaluated to be excellent, and the interconnect in which slit-like voids 13 are generated to some extent not to cause breakage is also evaluated to be excellent.

However, when slit-like voids are generated, they actually lead to the breakage. As shown in FIG. 7, a slit-like void 13 is inevitably grown along the direction of arrow 15 by Joule heating upon current-carrying, which eventually causes the breakage as shown in FIG. 8. The prior art method cannot detect such a failure as shown in FIG. 5.

2

Even when the electromigration test without stress-migration test evaluates an interconnect with line width of 0.3 μm or 0.2 μm such that MTF (mean time to failure until 50% of cumulative percent defective) is excellent, the stress-induced migration test possibly evaluates the interconnect to be defective.

SUMMARY OF THE INVENTION

An object of the present invention is to solve the above-described problems, and to perform a reliability evaluation test under a test environment compatible with an actual device operating environment. Namely, by performing a test under the condition that both electromigration and stress-induced migration are simultaneously accelerated, and the accuracy of the test of evaluating the reliability of a metal interconnect of a semiconductor device is improved. The present invention makes it possible to evaluate failures, which are conventionally missed during evaluation, and hence to provide a method of evaluating a metal interconnect with a high reliability.

According to the present invention, there is provided a method of evaluating the reliability of a metal interconnect of a semiconductor device, comprising: a first step of performing a constant-temperature storage test for a test piece of a semiconductor device at a temperature higher than room temperature, which is in a range of 20° C. to 25° C. for a time period; and a second step of applying a current to a metal interconnect of the test piece of the semiconductor device subjected to the constant-temperature storage test, and simultaneously performing a test for measuring the voltage of the metal interconnect.

The above test piece of semiconductor device may be used in the form of a semiconductor wafer or a cut-off semiconductor wafer sealed in a package.

The constant-temperature storage test is made by repeating a step of measuring a resistance of the metal interconnect, and a step of measuring a resistance of the metal interconnect after being left for a specified time. As for the resistance of the metal interconnect, the resistance at room temperature is taken as an initial value; or the resistance of the metal interconnect heated at a temperature of 100° C. or more is taken as an initial value. In the former, the metal interconnect is heated at room temperature or more, being kept for a specified time, and is cooled to room temperature. The resistance is then measured. The change in resistance of the metal interconnect with time is thus observed. In the latter, the metal interconnect is left at such a temperature that the initial value is measured, and the change in resistance is observed for each specified time.

In the second process, an electromigration test is performed by increasing the temperature of a susceptor on which a test piece is placed, preferably, up to about 200° C., applying a constant current with a high density of $1\times10^6$ A/cm$^2$ or more, and measuring the lifetime.

An apparatus suitable for carrying out the reliability evaluating method of the present invention includes a first test chamber having a first susceptor for mounting a test piece, and a first measuring means for measuring a resistance of the test piece; a second test chamber having a second susceptor for mounting the test piece, a means for heating the second susceptor, and a second measuring means for measuring a voltage of the metal interconnect while applying a current to the metal interconnect; and a carriage chamber for carrying the test piece between the first test chamber and the second chamber. The stress-induced migration test is performed using the first test chamber and the second test chamber; and the electromigration test is performed using the second test chamber.

In the method of evaluating the reliability of a metal interconnect according to the present invention, a constant-temperature storage test is first performed at a specified temperature over room temperature, for example, at a temperature of 100° C. or more. Voids due to stress-induced migration are possibly generated in the metal interconnect until an elapse of a specified time, for example 2000 hr. The voids are formed in various shapes depending on the line width and the size of the crystal grains. When the line width is smaller than the size of the crystal grains, each void is of, the so-called "bamboo" structure, and is formed in a slit-shape. On the contrary, when the line width is larger than the size of the crystal grains, each void is formed in a wedge-shape.

The test piece after the constant-temperature storage test is subjected to an electromigration test under current-carrying. At this time, the portion where a void is heat-generated due to the large local concentration of current density.

Failure modes caused by the electromigration test after the constant-temperature storage test will be described with reference to FIGS. 4 to 8.

In a layered Al interconnect 12 with a barrier metal 11 such as TiN (FIG. 4), slit-like voids 13 as shown in FIG. 5 may possibly be generated after the constant-temperature storage test. In this case, the prior art stress-induced evaluation fails to detect such a failure because the resistance is little changed and the electric conduction is kept by the redundant effect of the barrier metal (FIG. 6). However, when the electromigration test is performed for the test piece, the flow of a current is concentrated in the barrier metal 11 as shown in FIG. 6. As a result, Joule heating is generated, and it accelerates the migration of the Al interconnect 12, as a result of which the degree of opening of the slit is gradually enlarged (FIG. 7) and eventually the barrier metal 11 is melted and broken as shown in FIG. 8.

In this way, the failure mode, which is not detected by separately performing the stress-induced migration test and electromigration test, can be reproduced and evaluated by the evaluating method of the present invention. The generation step of the failure mode is compatible with an actual device operating environment.

DESCRIPTION OF THE PREFERRED EMBODIMENTS

Hereinafter, embodiments of the present invention will be described with reference to the drawings. However, it will be understood that the embodiments are illustrative only and not restrictive.

Embodiment 1

In this embodiment, a method of evaluating the reliability of a metal interconnect according to the present invention was carried out using a packaged semiconductor test piece, that is, a semiconductor test piece which was cut from a semiconductor wafer and was sealed in a package.

The interconnect structure of the test piece was of a layered structure of AlSiCu (500 nm)/Ti(30 nm)/TiN (70 nm)/Ti (30 nm), with a cover film of P-SiN (750 nm). The test piece was provided at both ends of the interconnect with current supply pads and voltage measuring pads, being subjected to bonding, and was sealed in a ceramic package. Fifty test pieces were measured for each test condition. The test piece was first set in a constant-temperature storage vessel kept at 150° C., and was applied with a voltage of −5 V. Thus, the resistance of the interconnect was calculated on the basis of readout current value. Next, the test piece was subjected to storage test in the constant-temperature storage vessel. In this way, a voltage was applied after each 100 hr and the current was measured and this was repeated until 2000 hours had elapsed. Voids were generated in the interconnect during this period. After that, the test piece was subjected to an electromigration test by increasing the temperature in the constant-temperature storage vessel up to 200° C. and applying a current with a current density of $5.0 \times 10^6$ A/cm$^2$ to the interconnect.

Figure 1:
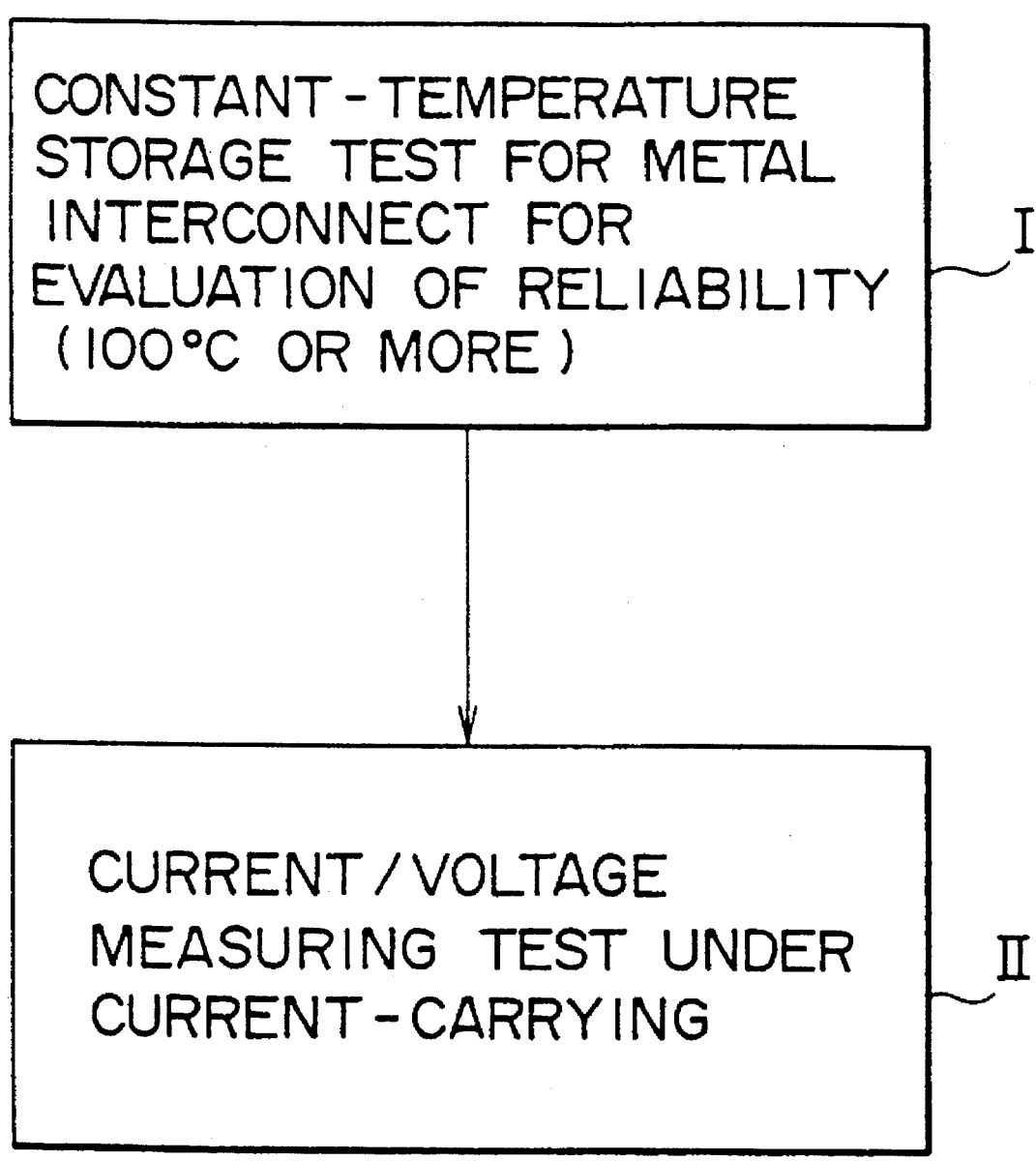
FIG. 1 is a flow chart showing a process of a first embodiment.

In this embodiment, as shown in FIG. 1, the stress-induced migration test was carried out by performing a constant-temperature storage test I for interconnect reliability evaluation (100° C. or more), and an electromigration test was then carried out by performing a current/voltage measuring test II under current-carrying at room temperature.

Embodiment 2

In this embodiment, a method of evaluating the reliability of a metal interconnect according to the present invention was carried out using a test piece in the form of a wafer.

The interconnect structure of the test piece was of a layered structure of AlSiCu (500 nm)/Ti(30 nm)/TiN (70 nm)/Ti (30 nm), with a cover film of P-SiN (750 nm). Both ends of the interconnect of the test piece were respectively provided with current supply pads and voltage measuring pads. One hundred chips were measured for each test condition. The resistance of the metal interconnect of the wafer was measured at room temperature. The wafer was then set in a constant-temperature storage vessel kept at 150° C., and was taken off, for example, after each 100 hr for measuring the resistance of the metal interconnect. This step was repeated, for example, until an elapse time of 2000 hr. Next, the wafer was set in an electromigration evaluating apparatus of an usual wafer level, and was subjected to an electromigration test at a susceptor temperature of 200° C. and at a current density of $7.0 \times 10^6$ A/cm$^2$.

In this embodiment, there were generated failure modes shown in FIGS. 4 to 8, so that the reliability of the metal interconnect can be evaluated. As a result, it was revealed that the same effect as that in the first embodiment could be obtained.

In this embodiment, both the constant-temperature storage test and the electromigration test can be performed in a single test chamber by placing a wafer on a susceptor provided in the single test chamber, and adjusting the temperature within the chamber and the temperature of the susceptor. However, the evaluation test in this embodiment can be performed using an evaluation apparatus shown in FIG. 2.

Figure 2:
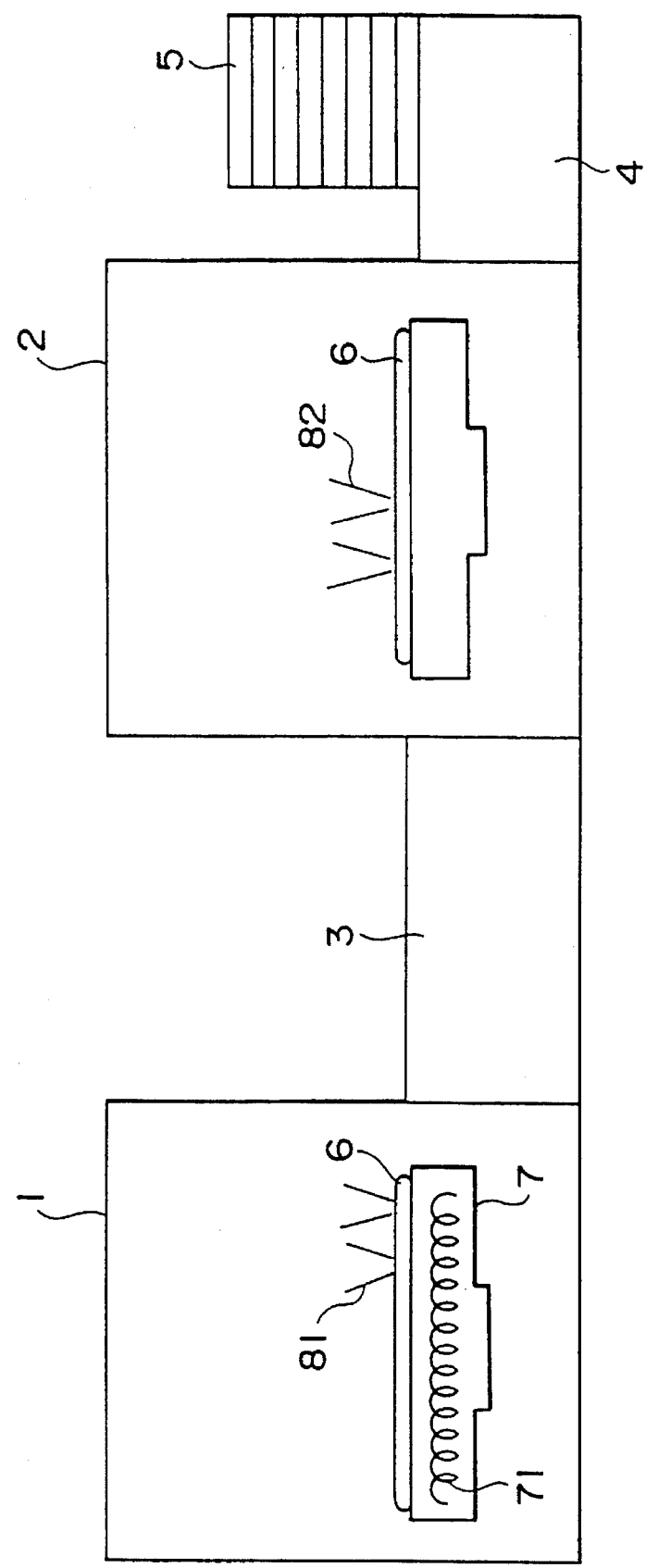
FIG. 2 is a view showing the construction of a reliability evaluating apparatus in the first embodiment.

In FIG. 2, reference numeral 1 designates a test chamber in which the electromigration test is performed; 2 is a test chamber for measuring a resistance of a metal interconnect at room temperature in the stress-induced migration test; 3 is a carriage chamber for connecting both the chambers 1 and 2 to each other. Here, the test chamber 1 is constituted of a constant-temperature storage vessel, and the test chamber 2 is constituted of a room temperature test chamber. Moreover, in this figure, reference numeral 4 designates a loader; 5 is a wafer cassette for containing wafers; 6 is a test piece for evaluation; 7 is a susceptor for supporting the test piece; 71 is a heater; 81 is a probe for testing electromigration; and 82 is a probe for testing stress-induced migration.

In this reliability testing apparatus, the test chamber 2 is a resistance measuring section for stress-induced migration test, and the test chamber 2 is a constant-temperature leaving section serving as an electromigration test chamber. The resistance of the test piece is measured in the test chamber 2 at room temperature. The test piece is then carried into the test chamber 1 by way of the carrying chamber 3. In the test chamber 1, the test piece is left for a specified time at a specified temperature over room temperature, and is returned to the test chamber 2. Thus, the resistance of the test piece is measured again in the test chamber 2. To measure the resistance of the test piece, the test chamber 2 is so constructed as to permit the applying of a specified voltage. Here, the test chamber 2 is taken as a room temperature chamber; however, it may be provided with means for keeping the temperature within the chamber constant. For example, the resistance is measured for each 100 hr, and the constant-temperature storage test is completed until an elapse of 2000 hr. After that, the test piece is carried into the test chamber 1, and is subjected to electromigration test of applying a current to the test piece and measuring the voltage. The test chamber 1 is so constructed as to permit the applying of a current with a high density of $1.0 \times 10^6$ A/cm² or more. Here, the electromigration test is performed by applying a current with a density of $5.0 \times 10^6$ A/cm². In the test chamber 1, the temperature of the test piece is controlled by the susceptor 7 containing the heater 7, for example, heated at 200° C. for testing.

Another embodiment of the reliability evaluating apparatus of the present invention will be described below.

Figure 3:
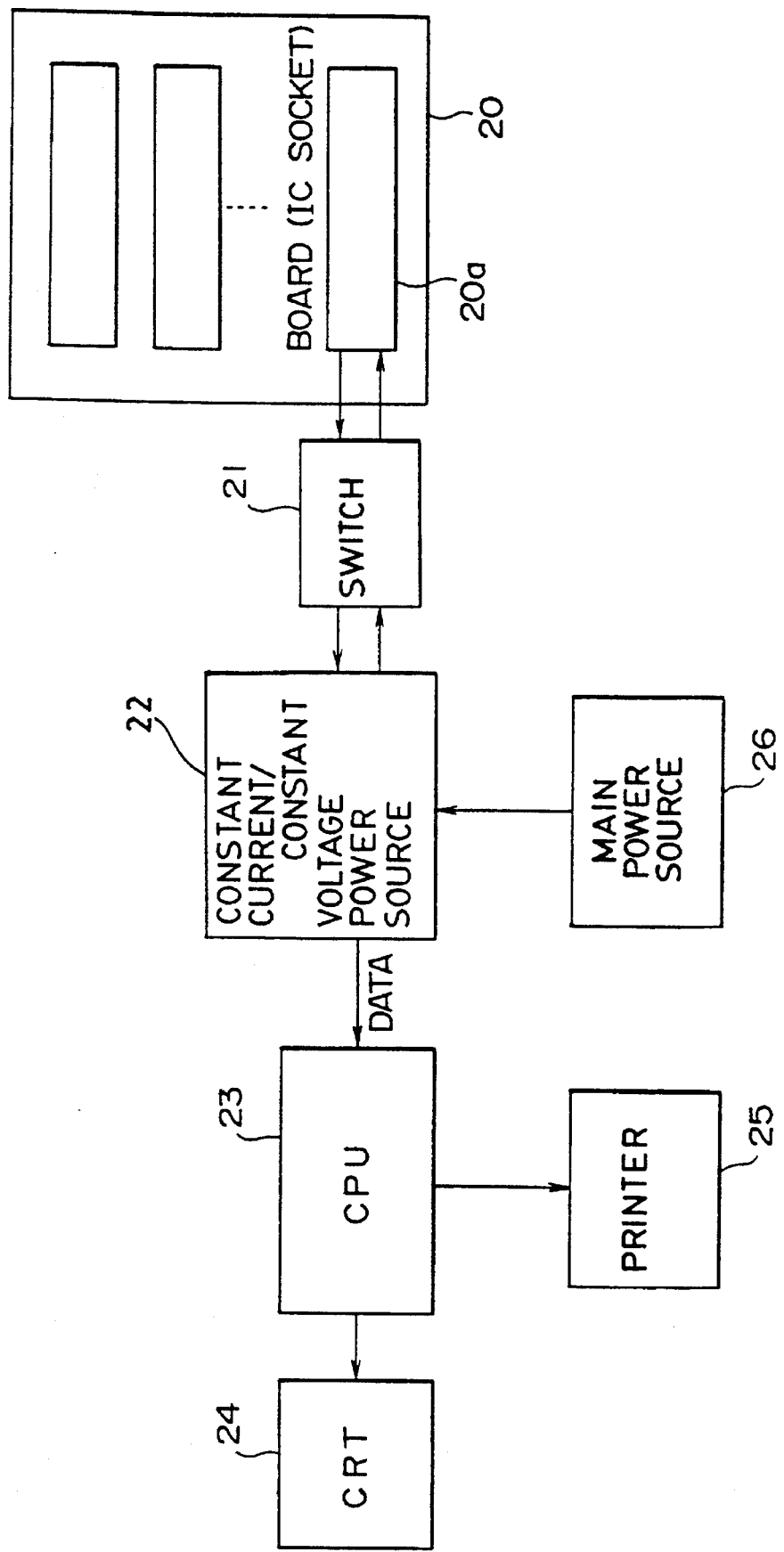
FIG. 3 is a block diagram showing a reliability evaluating apparatus in a third embodiment.
Figure 4:
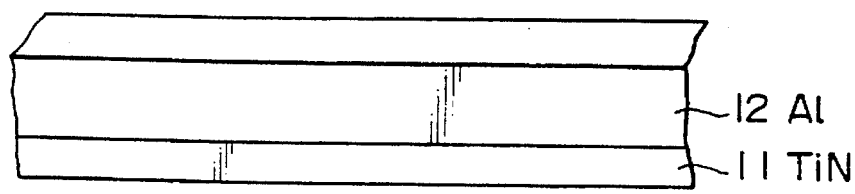
FIG. 4 is a view showing a failure mode of metal interconnect (1)
Figure 5:
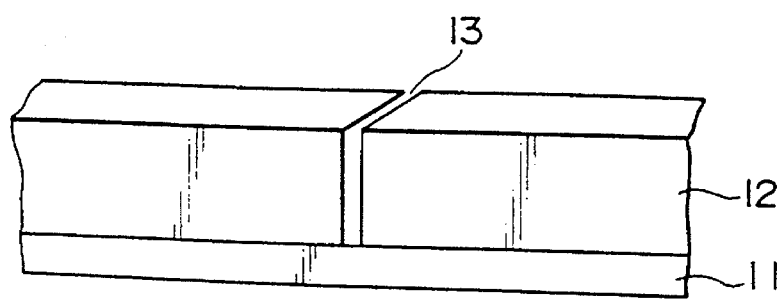
FIG. 5 is a view showing a failure mode (2) of metal interconnect.
Figure 6:
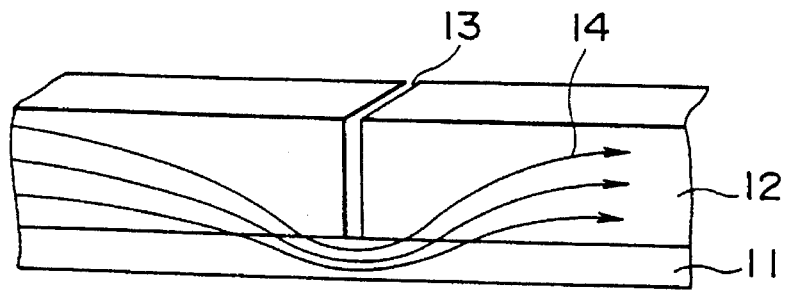
FIG. 6 is a view showing a failure mode (3) of metal interconnect.
Figure 7:
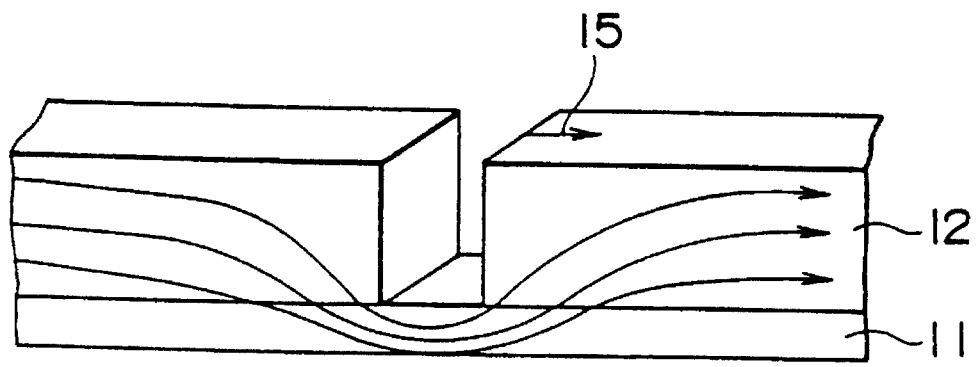
FIG. 7 is a view showing a failure mode (4) of metal interconnect.
Figure 8:
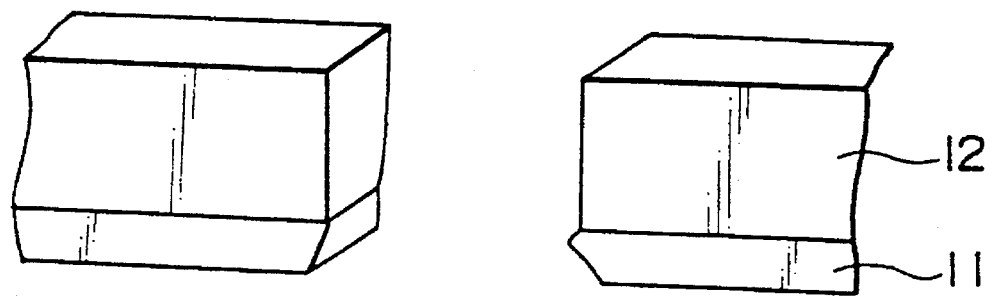
FIG. 8 is a view showing a failure mode (5) of metal interconnect.

FIG. 3 is view showing the construction of the reliability evaluation apparatus of this embodiment. A sample was set on a board 20a mounting an IC socket within a constant-temperature storage vessel 20. The board 20a capable of freely setting a current and a voltage was connected to a constant current/constant voltage power source 22 having a current meter/voltage meter by way of a switch 21. The constant current/constant voltage power source 22 was connected to a computer 23 for fetching data and displaying the data on a CRT 24. Moreover, by data processing software, the test results can be automatically graphed by a printer 25. Reference numeral 26 designates a main power source.

According to the above-described embodiments, the following effect can be obtained.

1. As compared with the prior art method of separately performing the electromigration evaluation test and stress-induced evaluation test, it becomes possible to reproduce the testing environment compatible with the actual device operating environment.

2. The test piece can be evaluated in the form of a package and wafer, and thus has a great deal of flexibility.

3. The evaluation of metal interconnect reliability can be performed with a high accuracy, which is very effective in the industrial viewpoint.

What is claimed is:

1. A method of evaluating the reliability of a metal interconnect of a semiconductor device, comprising:

a step of measuring the start-up resistance of said metal interconnect of a test piece of semiconductor device;

a step of performing a constant-temperature storage test for said test piece of semiconductor device for a time period made by measuring a resistance of said metal interconnect after being left at a temperature higher than 25° C. for a specified time and comparing said resistance of said metal interconnect with the start-up resistance of said metal interconnect; and a step of applying a current to said metal interconnect of said test piece of semiconductor device subjected to said constant-temperature storage test, and simultaneously performing a test of measuring the resistance of said metal interconnect, and comparing said resistance of said metal interconnect with said start-up resistance of said metal interconnect.

2. A method of evaluating the reliability of a metal interconnect according to claim 1, wherein said test piece of semiconductor device is a semiconductor wafer.

3. A method of evaluating the reliability of a metal interconnect according to claim 1, wherein said test piece of semiconductor device is a cut-off semiconductor wafer sealed in a package.

4. A method of evaluating the reliability of a metal interconnect according to claim 1, wherein said constant-temperature storage test is made at a temperature of 100° C. or more.

5. A method of evaluating the reliability of a metal interconnect according to claim 1, wherein the current density of said applied current is $1 \times 10^6$ A/cm² or more.

6. A method of evaluating the reliability of a metal interconnect according to claim 1, wherein said constant-temperature storage test is made by repeating a step of measuring a resistance of said metal interconnect after being left at said temperature higher than 25° C. for a specified time.

7. A method of evaluating the reliability of a metal interconnect according to claim 1, wherein said constant temperature storage test is made by repeating a step of measuring a resistance of said metal interconnect at about 25° C. after being left at said temperature higher than 25° C. for a specified time.

8. A method of evaluating the reliability of a metal interconnect according to claim 1, wherein said constant-temperature storage test is made by repeating a step of measuring a resistance of said metal interconnect at said temperature higher than 25° C. after being left at said temperature higher than 25° C. for a specified time.

9. A method of evaluating the reliability of a metal interconnect according to claim 1, wherein said test of simultaneously measuring said resistance of said metal interconnect applying said current to said metal interconnect of said test piece of semiconductor device subjected to said constant-temperature storage test is performed at a temperature higher than 25° C.

10. A method of evaluating the reliability of a metal interconnect according to claim 1, wherein said test of simultaneously measuring said resistance of said metal interconnect applying said current to said metal interconnect of said test piece of semiconductor device subjected to said constant-temperature storage test is performed at a temperature of 200° C. or more.

11. A method of evaluating the reliability of a metal interconnect according to claim 1, wherein said start-up resistance and said resistance of said metal interconnect measured in said constant-temperature storage test are calculated based on each current value measured when applying a voltage to said test piece of semiconductor device.

12. A method of evaluating the reliability of a metal interconnect according to claim 1, wherein said resistance of said metal interconnect measured in said test simultaneously performing applying said current is calculated based on a voltage measured when applying a constant current to said test piece of semiconductor device.

13. An apparatus for evaluating the reliability of a metal interconnect of a semiconductor device, comprising:

a first test chamber having a first susceptor for mounting a test piece, and first measuring means for measuring a resistance of said test piece mounted on said first susceptor, said test piece being a semiconductor device having a metal interconnect;

a first power source connected to said first chamber;

a second test chamber having a second susceptor for mounting said test piece, means for heating said second susceptor, and second measuring means for measuring a voltage of said metal interconnect;

a second power source connected to said second chamber for supplying a constant current to said second chamber; and a carriage chamber for carrying said test piece between said first test chamber and said second chamber.

14. An apparatus for evaluating the reliability of a metal interconnect according to claim 13, wherein said first test chamber has means for keeping the temperature within said chamber constant.

15. An apparatus for evaluating the reliability of a metal interconnect according to claim 13, wherein said first test chamber constitutes a resistance measuring section for stress-induced migration test, and second test chamber constitutes a constant-temperature section for stress-induced migration test.

16. An apparatus for evaluating the reliability of a metal interconnect according to claim 13, wherein said second test chamber constitutes an electromigration test chamber.

17. An apparatus for evaluating the reliability of a metal interconnect of a semiconductor device according to claim 13, wherein said second power source supplies a current with a high density of at least $1\times10^6 A/cm^2$ to said second chamber.

18. An apparatus for evaluating the reliability of a metal interconnect of a semiconductor device according to claim 13, wherein said first power source supplies a constant voltage to said first chamber.

* * * * *